United States Patent
Bedeschi et al.

(10) Patent No.: US 10,475,489 B2
(45) Date of Patent: *Nov. 12, 2019

(54) VARIABLE FILTER CAPACITANCE

(71) Applicant: Micron Technology, Inc., Boise, ID (US)

(72) Inventors: Ferdinando Bedeschi, Biassono (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/020,834

(22) Filed: Jun. 27, 2018

(65) Prior Publication Data

US 2019/0035441 A1 Jan. 31, 2019

Related U.S. Application Data

(63) Continuation of application No. 15/662,218, filed on Jul. 27, 2017, now Pat. No. 10,032,496.

(51) Int. Cl.
*G11C 7/14* (2006.01)
*G11C 11/22* (2006.01)
(Continued)

(52) U.S. Cl.
CPC .............. *G11C 7/14* (2013.01); *G11C 5/063* (2013.01); *G11C 8/08* (2013.01); *G11C 8/14* (2013.01);
(Continued)

(58) Field of Classification Search
CPC .............. G11C 11/221; G11C 11/2253; G11C 11/2297; G11C 11/24; G11C 11/408;
(Continued)

(56) References Cited

U.S. PATENT DOCUMENTS 5,373,463 A 12/1994 Jones, Jr.
5,745,402 A 4/1998 Arase
(Continued)

OTHER PUBLICATIONS

ISA/KR, International Search Report and Written Opinion of the International Search Authority, Int'l. Appl. No. PCT/US2018/042931, dated Nov. 19, 2018, Korean Intellectual Property Office, Seo-gu, Daejeon, Republic of Korea, 12 pgs.
(Continued)

*Primary Examiner* — Tan T. Nguyen
(74) *Attorney, Agent, or Firm* — Holland & Hart LLP

(57) ABSTRACT

Methods, systems, and devices for variable filter capacitance are described. Within a memory device, voltages may be applied to access lines associated with two voltage sources to increase the capacitance provided by the access lines between the two voltage sources. In some cases, the access lines may be in electronic communication with capacitive cells that include a capacitive element and a selection component, and the voltage sources and access lines may be configured to utilize the capacitive elements and the capacitance between the access lines to generate an increase capacitance between the voltage sources. In some cases, decoders may be used to implement certain configurations that generate different capacitance levels. Similarly, sub-decoders may generate different capacitance levels by selecting portions of a capacitive array.

20 Claims, 9 Drawing Sheets

(51) Int. Cl.
*G11C 11/24* (2006.01)
*G11C 11/408* (2006.01)
*G11C 5/06* (2006.01)
*G11C 8/08* (2006.01)
*G11C 8/14* (2006.01)
*G11C 5/14* (2006.01)

(52) U.S. Cl.
CPC ........ *G11C 11/221* (2013.01); *G11C 11/2253* (2013.01); *G11C 11/2297* (2013.01); *G11C 11/24* (2013.01); *G11C 11/408* (2013.01); *G11C 5/147* (2013.01)

(58) Field of Classification Search
CPC ........... G11C 5/063; G11C 5/147; G11C 7/14; G11C 8/08; G11C 8/14
USPC .......................................... 365/149, 150, 145
See application file for complete search history.

(56) References Cited

U.S. PATENT DOCUMENTS

| | | | |
|---|---|---|---|
| 5,969,380 A | 10/1999 | Seyyedy | |
| 5,969,979 A | 10/1999 | Hirano | |
| 5,995,406 A | 11/1999 | Kraus et al. | |
| 6,191,990 B1 | 2/2001 | Itoh et al. | |
| 6,256,220 B1 | 7/2001 | Kamp | |
| 6,285,573 B1 | 9/2001 | Park | |
| 6,297,624 B1 | 10/2001 | Mitsui et al. | |
| 6,979,849 B2 | 12/2005 | Lane | |
| 7,459,362 B2 | 12/2008 | Juengling | |
| 7,944,732 B2 | 5/2011 | de Jong et al. | |
| 9,390,781 B2 | 7/2016 | Matsuura | |
| 9,768,181 B2 | 9/2017 | Chavan et al. | |
| 9,922,716 B2 | 3/2018 | Hsiung et al. | |
| 10,032,496 B1 * | 7/2018 | Bedeschi | G11C 7/14 |
| 2002/0159307 A1 | 10/2002 | Hasegawa et al. | |
| 2005/0248996 A1 | 11/2005 | Schneider et al. | |
| 2008/0273311 A1 | 11/2008 | Biunno | |
| 2008/0298139 A1 * | 12/2008 | Fisch | G11C 5/147 365/189.09 |
| 2011/0317507 A1 * | 12/2011 | Nakazawa | G11C 8/08 365/230.03 |
| 2012/0243298 A1 | 9/2012 | Hush | |
| 2016/0111138 A1 | 4/2016 | Izumi et al. | |

OTHER PUBLICATIONS

ISA/KR, International Search Report and Written Opinion of the International Search Authority, Int'l. Appl. No. PCT/US2018/043521, dated Oct. 29, 2018, Korean Intellectual Property Office, Seo-gu, Daejeon, Republic of Korea, 10 pgs.

* cited by examiner

VARIABLE FILTER CAPACITANCE

CROSS REFERENCE

The present Application for Patent is a continuation of U.S. patent application Ser. No. 15/662,218 by Bedeschi et al., entitled "Variable Filter Capacitance," filed Jul. 27, 2017, assigned to the assignee hereof, and which is expressly incorporated by reference in its entirety herein.

BACKGROUND

The following relates generally to memory devices and more specifically to varying a filter capacitance in the memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

In some memory architectures, voltage variations, due to an imperfect voltage source, for instance, may result in reading and writing errors. In some examples, a filter capacitance may be introduced to mitigate the effect of variations in a voltage. A large capacitance may increase a device's ability to dampen the effect of undesired voltage variations as compared to a smaller capacitance. However, a large capacitance may occupy a larger chip area and consume more power than a smaller capacitance, reducing the memory capacity and battery life of a device.

BRIEF DESCRIPTION OF THE DRAWINGS

The disclosure herein refers to and includes the following figures.

DETAILED DESCRIPTION

Figure 1:
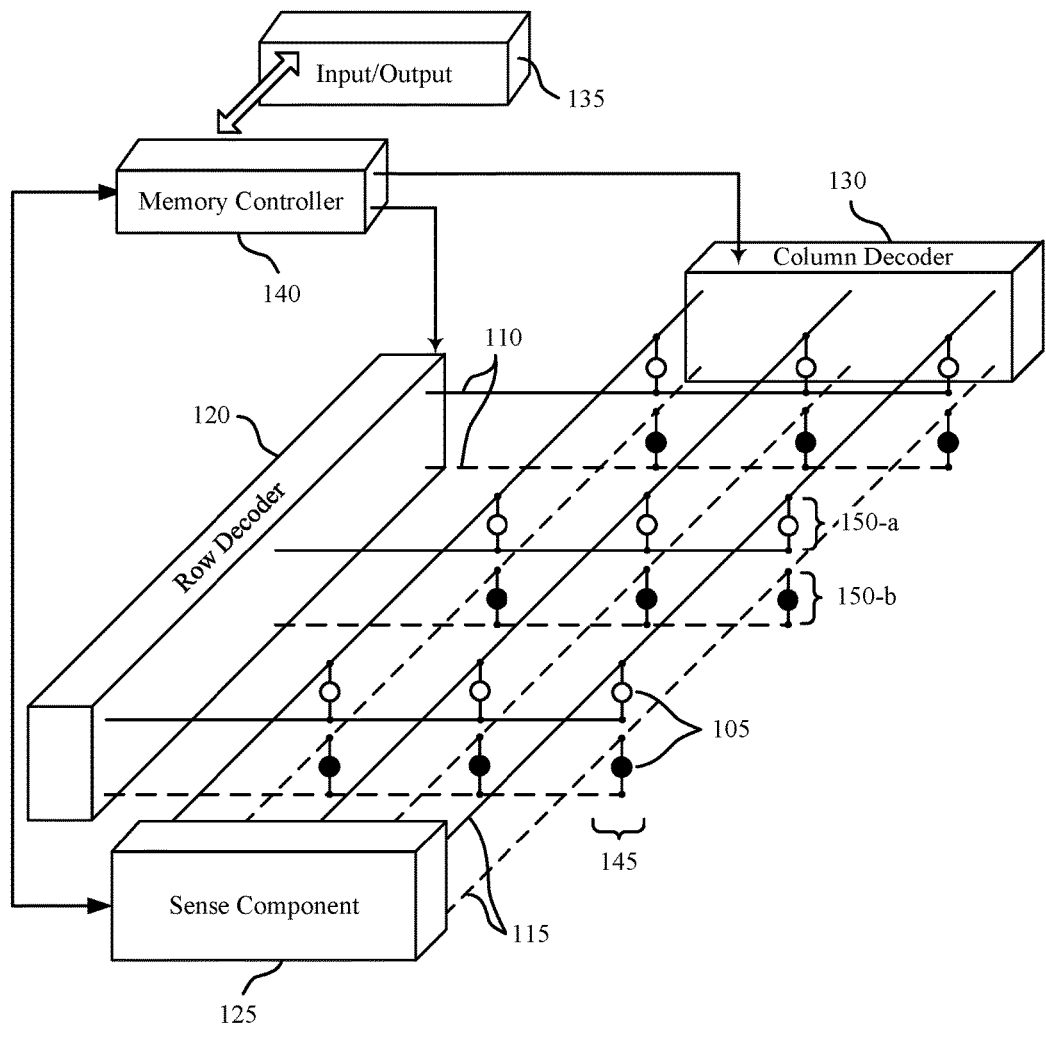
FIG. 1 illustrates an example memory array that supports varying a filter capacitance in accordance with various embodiments of the present disclosure.

A variable filter capacitance may be implemented in a circuit to allow a device to modify the capacitance associated with a voltage source. A variable filter capacitance may be formed using memory-type cells that are located on a memory layer and not used to store logic states to increase chip area utilization.

For example, a memory component may include multiple memory layers. Each memory layer may include one or more memory arrays and two perpendicular strips (i.e., strips perpendicular to one another). In some embodiments, a first perpendicular strip may be or may include a spine. The spine may be associated with thick pillar structures (i.e., thicker relative to pillars in a memory array) that increase the structural integrity of a memory component and/or may be a region used by decoding circuitry to access one or more memory arrays. For example, the spine may include conductive traces that connect one or more decoders to one or more access lines that are electronically connected to the one or more memory arrays. In some embodiments, a second perpendicular strip may be or may include a periphery. The periphery may be a region used by circuitry for operating a memory array. In some cases, the periphery may extend outside of a memory array footprint in any direction. In some examples, the periphery may be associated with any of the regions of the memory component that are not allocated to a memory array.

The spine and periphery may partition the memory layer into four sub-areas, which may be allocated to individual memory arrays, while the two perpendicular strips may be used for other operations. For instance, the spine and periphery may be used to support control circuitry for accessing the memory arrays. However, in such a configuration the control circuitry may have a different structure than the memory cells, thus, different manufacturing techniques may be used to form the memory arrays than are used to form the control circuitry. Moreover, changes in the manufacturing process may increase the number of processing defects. Thus, as described herein, a memory layer may be constructed so that a single structure is uniformly (or nearly uniformly) disposed across the entirety of the memory layer, reducing defects that occur during the manufacturing process.

For instance, a memory layer may be formed so that memory-type cells are uniformly disposed across the memory layer. A memory-type cell may include a capacitive element and a selection component used for inserting and isolating the capacitive element into a circuit. The memory array may also include multiple sets of conductive traces (which may be referred to as access lines) that are in electronic communication with the memory-type cells. The access lines may include a first set of access lines that extends in a first direction (which may be referred to as digit or column lines), and a second set of access lines that extends in a second direction perpendicular to the first direction (which may be referred to as word or row lines). As discussed above, the memory layer may be partitioned into four memory arrays because of the spine and periphery. The memory-type cells disposed on the memory arrays may be referred to as memory cells. The memory cells may include a memory storage element (e.g., a linear or non-linear capacitor) and a selection device, and may be used to store logic states for other hardware or software applications. The access lines that are in electronic communication with the memory cells may be used for reading to or write from the memory cells.

In some cases, extra metal layers are added to the spine and periphery of the memory layer to increase the structural integrity of the memory component. As a result, the memory-type cells on the spine and periphery may not be used to store logic states like memory cells located in the memory arrays. Accordingly, the memory-type cells on the spine and periphery may instead be referred to as capacitive cells to differentiate them from memory cells, despite being similarly constructed. In some examples, the capacitive cells and access lines that are in electronic communication with the capacitive cells may be used to generate a variable capacitance and to filter out irregularities in a voltage.

By way of example, in a first configuration, a first subset of column lines associated with the spine and/or the periphery may be connected to a positive voltage associated with a first voltage rail while a second subset of the column lines is connected to ground or virtual ground. Column lines from the first subset of column lines associated with the spine and periphery may alternate in position with column lines from the second subset of the column lines (e.g., a first column line may be associated with the first subset; a second column line, adjacent to the first column line, may be associated with the second subset; a third column line, adjacent to the second column line, may be associated with the first subset, and so on). Row lines associated with the spine and periphery may be left isolated form the voltage rails or floating. In this way, the capacitance between adjacent column lines may be aggregated to form one larger filter capacitance between the positive voltage and ground or virtual ground.

Similarly, in a second configuration, a first subset of row lines associated with the spine and periphery may be connected to a positive voltage associated with the first voltage rail while a second subset of the row lines associated with the spine and periphery may be connected to ground or virtual ground. This may further increase the filter capacitance between the positive voltage and ground or virtual ground by adding the capacitance between row lines, and may additionally add capacitance from the capacitive cells into the filter capacitance.

In a third configuration, the row lines associated with the spine and periphery may be isolated from the positive voltage and the ground or virtual ground, or in other words the row lines may be left floating. This configuration may reduce current leakage from the positive voltage to the ground or virtual ground resulting from shorts between access lines that develop during the manufacturing process. In yet other cases, the row lines associated with the spine and periphery may be connected to an intermediary voltage that is smaller than the positive voltage and larger than the ground or virtual ground. This configuration may prevent the capacitive cells from being accessed which may decrease current leakage from the positive voltage to the ground or virtual ground through the capacitive cells. The memory component may implement different configurations or combinations of configurations, according to certain scenarios experienced by the memory component. For instance, the first configuration may be used when the device is connected to a power source or has a high battery level, the second configuration may be used when the device is operating only on battery power, and the third configuration may be used when the device is low on battery or is in a low power or standby mode.

Features and techniques introduced above are further described below in the context of a memory array. Specific examples are then described for discharging untargeted memory cells after accessing a target memory cell. These and other features of the disclosure are further illustrated by and described with reference to apparatus diagrams, system diagrams, and flowcharts that relate to reading or writing non-volatile memory cells.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may store charge representative of the programmable states in a capacitor; for example, a charged and uncharged capacitor may represent two logic states, respectively. DRAM architectures may commonly use such a design, and the capacitor employed may include a dielectric material with linear or paraelectric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where two-dimensional (2D) memory arrays are formed on top of one another. For instance, memory array 100 may include a first memory layer 150-*a* and a second memory layer 150-*b*. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110, and each column of memory cells 105 is connected to a bit line 115. Access lines 110 may also be known as word lines 110, and bit lines 115 may also be known digit lines 115. References to word lines and bit lines, or their analogues, are interchangeable without loss of understanding or operation. Word lines 110 and bit lines 115 may be substantially perpendicular to one another to create an array.

As shown in FIG. 1, a first memory cell 105 in a memory cell stack 145 may be in electronic communication with a digit line 115 and a word line 110, while a second memory cell 105 in the memory cell stack 145 may be in electronic communication with a second digit line 115 and a second word line 110. In some cases, two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

In some cases, each memory layer 150 may include multiple memory arrays 100 (e.g. four memory array) that are separated by a spine that extends across a central portion of the layer in a first direction and a periphery that extends across another central portion of the layer in a second direction that is perpendicular to the first direction. In some examples, the spine and periphery may support control circuitry for accessing each of the memory arrays, such as row and column decoders and sense components. In another examples, capacitive cells, similarly constructed as memory cells 105 located in the memory arrays 100, may be disposed on the spine and periphery and the control circuitry may be located on the bottom memory layer 150 of the memory. The capacitive cells, although constructed similarly to memory cells 105, may not be used to store logic states due to extra metal layers being added to the spine and periphery to increase the strength and material reliability of a memory layer 150. Disposing capacitive cells across the spine and periphery may reduce physical defects that occur during the manufacturing process since similar manufacturing techniques can be used to form both the memory cells in the memory arrays 100 and capacitive cells in the spine and periphery.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as input/output 135. In some cases, sense component 125 may be a part of column decoder 130 or row decoder 120. Or, sense component 125 may be connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Ferroelectric memory cells 105 may have beneficial properties that may result in improved performance relative to other memory architectures.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control voltages applied to row and column lines corresponding to a spine and periphery of a memory layer 150 to modify a filter capacitance used to regulate irregularities in a voltage. For instance, memory controller 140 may trigger a first decoder to connect a first voltage to a first subset of digit lines 115 and a second voltage to a second subset of digit lines 115. Similarly, memory controller 140 may be used to trigger a second decoder to connect the first voltage to a first subset of word lines 110 and the second voltage to a second subset of word line 110. Or memory controller 140 may trigger the second decoder to isolate the word lines 110 from the first and second voltages.

Figure 2:
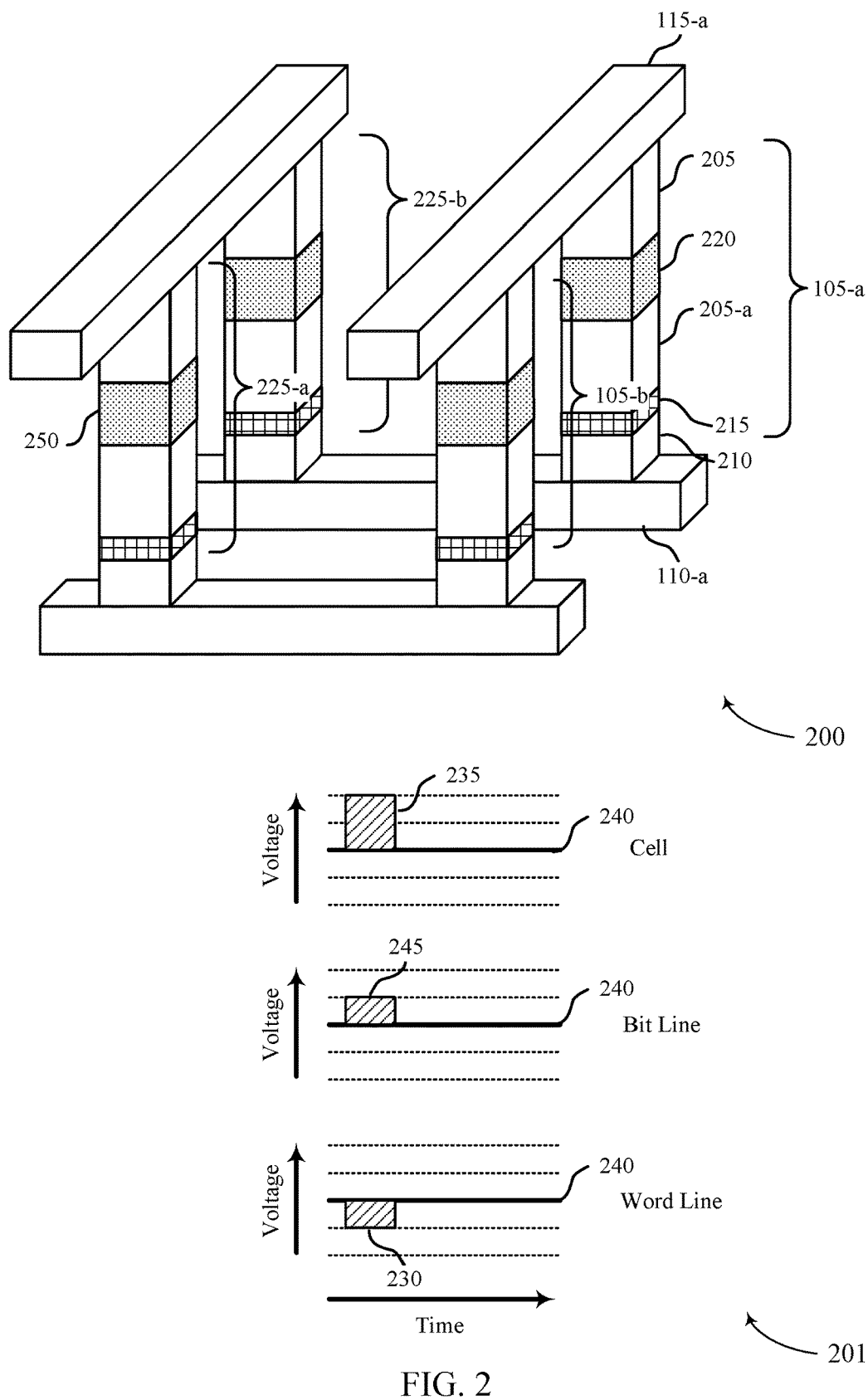
FIG. 2 illustrates components of an example memory array and voltage plot that supports varying a filter capacitance in accordance with various embodiments of the present disclosure.

FIG. 2 illustrates an example portion of a memory layer 200 and an example voltage plot 201 that supports reading and writing non-volatile memory cells and discharging untargeted memory cells in accordance with various embodiments of the present disclosure. Memory layer 200 may be an example of a memory layer 150 described with reference to FIG. 1. Memory layer 200 includes memory cell 105-a, memory cell 105-b, word line 110-a, and bit line 115-a, which may be examples of a memory cell 105, word line 110, and bit line 115, as described with reference to FIG. 1. Memory layer 200 also includes capacitive cell 225-a and capacitive cell 225-b.

Memory cell 105-a includes electrode 205, electrode 205-a, memory element 220, which may be a ferroelectric material, and selection component 215. Electrode 205-a may be referred to as a middle electrode 205-a. Memory layer 200 also includes bottom electrodes 210. Capacitive cell 225-a may be similarly constructed to memory cell 105-a but may include capacitor 250, which may be a linear or non-linear capacitance. Moreover, the pillars forming capacitive cell 225-a may be thicker than the pillars forming memory cell 105-a and memory cell 105-b to increase the structural integrity of the memory layer 200. In some examples, memory cell 105-a and memory cell 105-b are located within a portion of the memory layer 200 reserved for memory storage, while capacitive cell 225-a and capacitive cell 225-b are located on the spine or periphery of memory layer 200.

Memory layer 200 may be referred to as a cross-point architecture. It may also be referred to as a pillar structure. For example, as shown in FIG. 2, a pillar may be in contact with a first conductive line (word line 110-a) and a second conductive line (bit line 115-a), where the pillar comprises a first electrode (bottom electrode 210), selection component 215, and ferroelectric memory cell 105-a, where ferroelectric memory cell 105-a includes a second electrode (electrode 205-a) ferroelectric memory element 220, and a third electrode (electrode 205). In some cases, electrode 205-a may be referred to as a middle electrode. In some cases, a 3D memory array may be formed by stacking multiple memory layers 200 on one another. The two stacked layers may, in some examples, have common conductive lines such that each level may share word lines 110 or bit lines 115 as described with reference to FIG. 1.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

There may also be an inherent capacitance between pillars and access lines. For example, there may be ~44.5 aF between each pillar including a memory cell 105. Thus, for a 2×2048 array of memory cells there may be up to ~100 fF of capacitance, and for a 2048×2048 memory array there may be up to ~100 pF of capacitance. Similarly, the pillars that include capacitive cells 225 may generate a capacitance; however, additional metal layers used to build up these pillars may increase the capacitance as compared to pillars including memory cells 105. For instance, there may be ~180 aF between capacitive cells. Thus, for a 2048×2048 capacitive array there may be up to ~400 pF of capacitance. Since capacitive cells 225 are typically not used to store logic states, a memory component may take advantage of their larger capacitance to generate a large filter capacitance that may be used to regulate voltages without using additional chip area.

Voltage plot 201 depicts voltages applied as a function of time during an access operation of a target memory cell 105. Prior to accessing a memory cell, such as memory cell 105-a, both the word line 110-a and digit line 115-a may be maintained at an inhibit voltage 240—i.e., a voltage that prevents discharging of the memory cell 105-a. For instance, both the word line 110-a and digit line 115-a may be maintained at an inhibit voltage 240 that is equivalent to a virtual ground. To access memory cell 105-a, both the word line 110-a and digit line 115-a may be energized by applying a voltage to them. That is, bit line access voltage 245 may be applied at the same time as word line access voltage 230. Because they have opposite polarities, the voltages applied to the word line 110-a and digit line 115-a may be additive, and the resulting voltage applied to target memory cell 105-a is cell access voltage 235. That is, in plot 201, bit line access voltage 245 has a positive polarity and word line access voltage 230 has a negative polarity, and the net sum across memory cell 105-a is cell access voltage 235.

In some examples, the inhibit voltage 240 may be an intermediary voltage, for example a mid-bias voltage. That is, instead of applying a positive bit line access voltage 245 and a negative word line access voltage 230 relative to a virtual ground, the bit line access voltage 245 and the negative word line access voltage 230 may be applied relative to an intermediary voltage. For instance, the memory array may be operated using only a positive voltage source and the magnitude of the intermediary voltage is between the magnitude of the positive voltage source and a virtual ground. In some examples, both bit line access voltage 245 and word line access voltage 230 are maintained at the intermediary voltage prior to an access operation of memory cell 105-a. And during an access operation, bit line access voltage 245 may be increased (e.g., to a positive supply rail) while word line access voltage 230 may be simultaneously decreased (e.g., to a virtual ground), generating a net voltage across memory cell 105-a.

Selection component 215 may, in some cases, be connected in series between a memory cell 105 and a conductive line, for example, between memory cell 105-a and at least one of word line 110-a or bit line 115-a. For example, as depicted in FIG. 2, selection component 215 may be located between electrode 205-a and bottom electrode 210; thus, selection component 215 is located in series between memory cell 105-a and word line 110-a. Other configurations are possible. For example, selection component may be located in series between memory cell 105-a and bit line 115-a. The selection component may aid in selecting a particular memory cell 105-a or may help prevent stray currents from flowing through non-selected memory cells 105-a adjacent a selected memory cell 105-a. It may also reduce the bias across untargeted memory cells, such as memory cell 105-b. For example, selection component 215 may have a threshold voltage such that a current flows through selection component 215 when the threshold voltage is met or exceeded. Selection component 215 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, selection component 215 is a chalcogenide film, for example, an alloy of selenium (Se), arsenic (As), and germanium (Ge).

Memory layer 200 may be made by various combinations of material formation and removal. For example, layers of material may be deposited that correspond to the word line 110-a, bottom electrode 210, selection component 215, electrode 205-a, memory element 220, and electrode 205. Material may be selectively removed to then create the desired features, such as the pillar structure depicted in FIG. 2. For example, features may be defined using photolithography to pattern a photoresist and then material may be removed by techniques such as etching. Bit lines 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory layer 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

In some cases, capacitor 250 may be a container-like capacitor and selection component 215 may be a three-terminal transistor, such as a thin-film transistor (TFT). In some examples, the TFT selection device is used as an alternative selections means instead of a non-linear or diode switch as discussed above. Using a three-terminal transistor to access capacitor 250 may include applying a voltage to a word line 110 activating the transistor and providing a conductive path between the capacitor 250 and a digit line 115. In some cases, accessing capacitor 250 may be accomplished by applying a voltage to the transistor using a word line 110, which may provide a conductive path from the capacitor 250 to a digit line 115, and applying another voltage to the capacitor 250 using a plate line, which may cause the capacitor 250 to discharge onto the digit line 115. In some cases, leakage currents through capacitor 250 may be reduced by using a three terminal selection device, such as a TFT device in place of a diode or diode-like device.

Figure 3A:
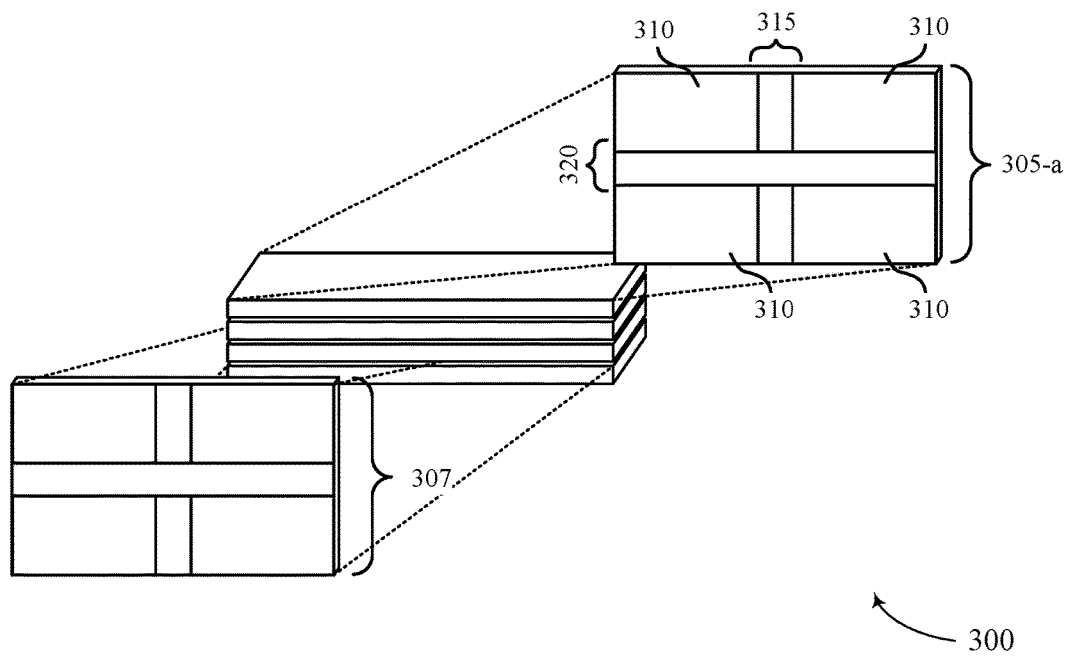
FIG. 3A illustrates an example memory component for a ferroelectric memory cell that support varying a filter capacitance in accordance with various embodiments of the present disclosure.
Figure 3B:
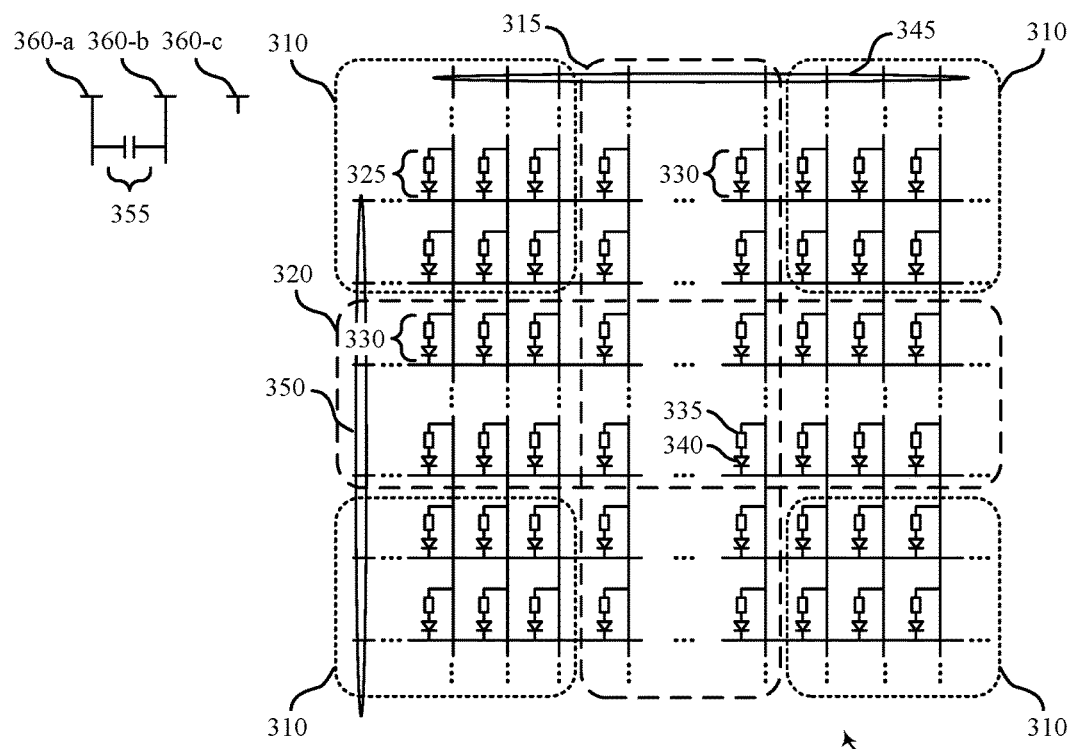
FIG. 3B illustrates an example memory layer in accordance with various embodiments of the present disclosure.

FIGS. 3A and 3B show an example memory component 300 that supports a variable filter capacitance in accordance with embodiments of the present disclosure. Memory component 300 may include multiple memory layers 305, such as first memory layer 305-a and control layer 307. In some examples, control layer 307 may be also be a memory layer. Each memory layer 305 may include memory arrays 310, a spine 315, and a periphery 320. In some cases, a control layer 307 is referred to as a CMOS-Under Array and includes control circuitry used for accessing memory cells 325 on other layers and for varying a capacitance of a capacitive element 355.

Voltage rails 360 may be used to supply a voltage to the access lines. In some cases, a voltage rail 360 is coupled with access lines via switches or decoders. In other cases a voltage rail 360 is directly coupled with by a permanent conductive trace connecting the voltage rail to an access line. In some cases, first voltage rail 360-a supplies a positive voltage, while second voltage rail 360-b is connected to ground or virtual ground. Third voltage rail 360-c may supply a voltage that is smaller than the voltage of voltage rail 360-a but larger than the voltage of voltage rail 360-b.

The spine 315 may include a first subset of the plurality of capacitive cells 330 that extend in a first direction and the periphery 320 may include a second subset of the plurality of capacitive cells 330 that extend in a second direction that is perpendicular to the first direction. In some cases, the spine 315 may be reinforced (e.g., the pillars in the spine region may be thicker than any other regions of memory component 300) to provide increased structural integrity to memory component 300. In some examples, circuitry and/or connections (e.g., conductive traces) for accessing memory arrays 310 are disposed on spine 315. For instance, circuitry and/or connections for decoding memory arrays 310 may be disposed on spine 315. In some cases, spine 315 includes conductive traces that electronically connect decoding circuitry on the bottom layer of memory component 300 with memory cells in memory arrays 310 on upper layers of memory component 300.

Note that the periphery 320 does not necessarily extend around the periphery of the memory layer 305-a, but instead may extend around the periphery of the memory arrays 310. In some cases, periphery 320 is defined as all portions of memory component 300 that is not allocated to memory arrays 310. In some cases, circuitry and/or connections (e.g., conductive traces) for accessing memory arrays 310 are disposed on periphery 320.

Memory layer 305-a may include memory arrays 310, which may use memory cells 325 to store logic states for hardware components, software applications, and the like. The spine 315 and the periphery 320 may include capacitive cells 330. The capacitive cells 330 may be constructed in a similar fashion as the memory cells 325, but the capacitive cells 330 may not be used to store data. Capacitive cells 330 may include a capacitor 335, which may be a linear capacitor (e.g., a dielectric capacitor, ceramic capacitor, etc.) or a non-linear capacitor (e.g., a ferroelectric), and a selection component 340 that may operate similar to a diode.

A first set of access lines 345, which may be referred to as digit or column lines and may be examples of digit lines 115 as described with reference to FIG. 1, may be in electronic communication with the memory cells 325 and the capacitive cells 330. The first set of access lines 345 may be oriented in a first direction. A second set of access lines 350, which may be referred to as word or row lines and may be examples of word lines 110 as described with reference to FIG. 1, may also be in electronic communication with the memory cells 325 and the capacitive cells 330. The second set of access line 350 may be perpendicular to the first set of access lines. Logic states may be written to or read from memory cells 325 by applying voltages to access lines of the first set of access lines 345 and the second set of access lines 350. Similarly, a capacitor 335 may be accessed by applying voltage to access lines of the first set of access lines 345 and the second set of access lines 350. But instead of accessing a capacitive element to write or read a logic state, accessing a capacitive element may introduce the capacitance of the capacitor 335 between a first voltage of the first access line 345 and a second voltage of the second access line 350.

Memory component 300 may use the access lines included in the spine 315 and periphery 320 to modify the capacitance between a voltage applied to the first set of access lines 345 (e.g., voltage rail 360-a) and the second set of access lines 350 (e.g., voltage rail 360-b). This capacitance may be equivalent to the capacitance of and represented by capacitive element 355. Capacitive element 355 may also be referred to as a filter capacitance. In some cases, the voltages applied to the access lines associated with capacitive cells 330 may cause capacitors 335 to be select and the magnitude of the capacitive element 355 to include the capacitance of these capacitors 335. Further details are provided below.

Figure 4A:
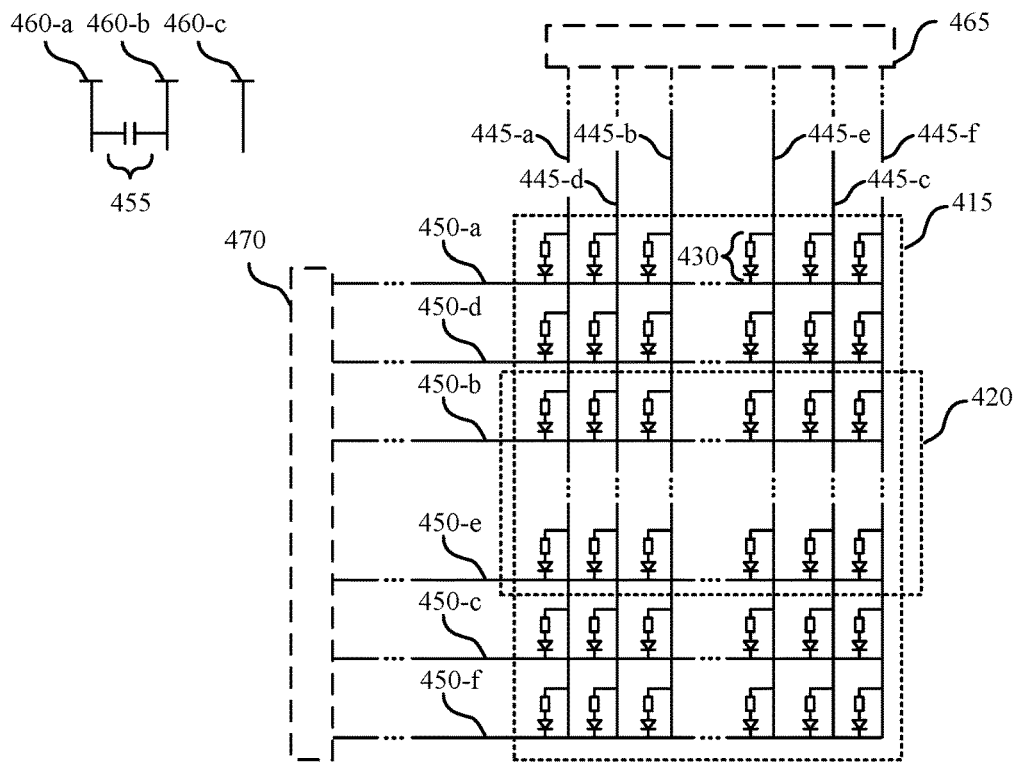
FIGS. 4A to 4C illustrate example spine configurations for varying a filter capacitance in accordance with various embodiments of the present disclosure.
Figure 4B:
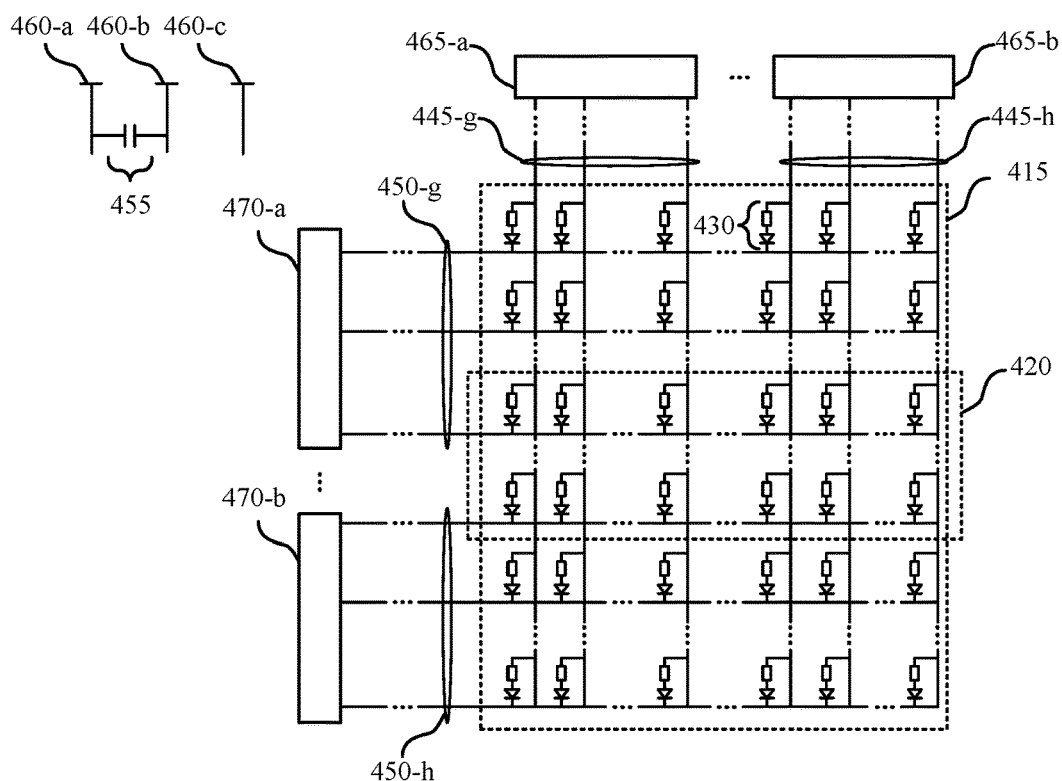
Figure 4C:
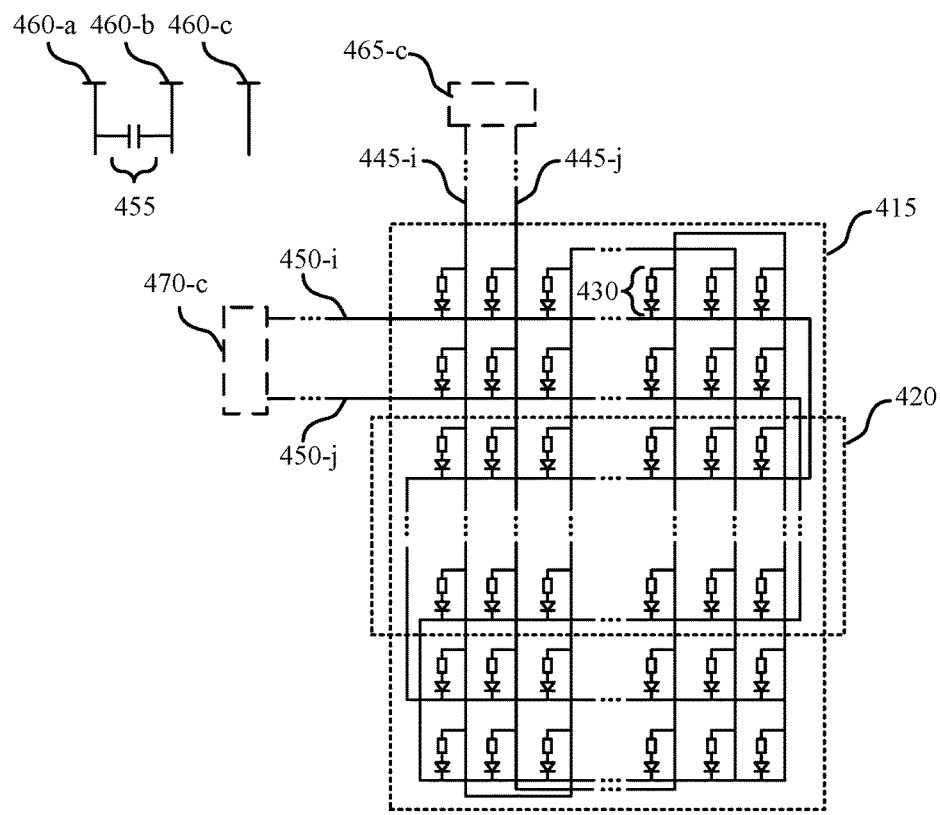

FIGS. 4A to 4C shows example configurations 400 of the spine 415 and periphery 420 for generating a variable filter capacitance in accordance with embodiments of the present disclosure. In FIG. 4A, configuration 400-a may include column lines 445-a to 445-f, row lines 450-a to 450-f, and voltage rails 460-a to 460-c. Configuration 400-a may also include spine 415 and periphery 420, which may each include capacitive cells 430. Configuration 400-a may optionally include a plurality of decoders, such as first decoder 465 (or column decoder 465) and second decoder 470 (or row decoder 470).

In some cases, column lines 445-a to 445-c are associated with a first subset of column lines 445 and column lines 445-d to 445-f are associated with a second subset of column lines 445. As shown, column lines 445-a to 445-c may be in an alternate position with respect to column lines 445-d to 450-f. Similarly, row lines 450-a to 450-c may be associated with a first subset of row lines 450 and row lines 450-d to 450-f may be associated with a second subset of row lines 450. Row lines 450-a to 450-c may be in an alternate with respect to row lines 450-d to 450-f.

The plurality of decoders may be in electronic communication with the first plurality of column lines 445, the second plurality of row lines 450, and the capacitive cells 430. The column decoder 465 may segment the array of memory cells in a first direction, while the row decoder 470 may segment the array of cell in a second direction, perpendicular or orthogonal to the first direction. The column decoder 465 may be in electronic communication with column line 445, while the row decoder 470 may be in electronic communication with row line 450. The plurality of decoders may be used to connect voltage rails 460-a through 460-c to column lines 445 and row lines 450 according to a desired configuration. In some cases, the column decoder 465 and the row decoder 470 are located on the bottom layer (e.g., control layer 307 described with reference to FIG. 3A) of the memory component while the memory arrays (e.g., memory array 310) and the capacitive cells 430 are located on one or more layers above the bottom layer. In other cases, the column decoder 465 and the row decoder 470 are located on the same layer as the memory arrays (e.g., memory array 310).

In some examples, column decoders 465 and row decoders 470 may be used to access capacitive cells 430. Column decoders 465 and row decoders 470 may be different from the decoders used to access memory cells or may be the same type of decoders but configured differently. For instance, at least one of column decoders 465 may be electronically connected with multiple row lines 450, while at least one row decoders 470 may be electronically connected with multiple column lines 445.

In some examples, voltage rails 460-a to 460-c are directly connected (e.g., through a permanent conductive path) to column lines 445 and row lines 450 so column decoders 465 and row decoders 470 are not used. In some cases, a switching component may be inserted between voltage rails 460-a through 460-c and the access lines. In some examples, voltage rail 460-a generates a positive voltage, voltage rail 460-b is connected to a ground or virtual ground, and voltage rail 460-c generates a voltage that is between the voltage of voltage rail 460-a and voltage rail 460-b. In some cases, voltage rail 460-a may be directly connected to column lines 445-a to 445-c and voltage rail 460-b may be directly connected to column lines 445-d to 445-f. This configuration may utilize the inherent capacitance between the column lines 445 and capacitive cells 430 to regulate voltage variations in voltage rails 460-a and 460-b. The inherent capacitance between the column lines 445 and capacitive cells 430 may be modeled as a single capacitive element 455. Moreover, by alternating the voltage every column line 445 this configuration may maximize the utilization of the inherent capacitance since the capacitance between each access line may contribute to the total value of the capacitive element 455.

Similarly, voltage rail 460-a may be directly connected to row lines 450-a to 450-c, while voltage rail 460-b may be directly connected to row lines 450-d to 450-f. In some cases, the voltage rails 460-a and 460-b may be simultaneously connected to the respective column lines 445 as described above. The voltage rails 460-a and 460-b may be connected so that the voltage of adjacent row lines 450-e alternate (i.e., the voltage of voltage rail 460-a is applied to row line 450-a, the voltage of voltage rail 460-b is applied to row line 450-b, the voltage of voltage rail 460-a is applied to row line 450-c, and so on). This configuration may maximize the utilization of the inherent capacitance. When voltage rails 460-a and 460-b are connected to both the column lines 445 and the row lines 450, the capacitance of capacitive element 455 may be equivalent to the sum of the capacitance from the column lines 445 and the row lines 450. Moreover, this configuration may activate certain capacitive cells 430 (e.g., when the voltage at column line 445-a—the voltage at row line 450-d is greater than the selection voltage for a capacitive cell 430). Thus, the capacitive element 455 may also include the capacitance of the capacitive cells 430.

In other examples, the row lines 450, including row lines 450-a to 450-d, may be isolated from the voltage rails 460-a to 460-c. This may be accomplished by failing to connect the row lines 450 to the voltage rails 460-a to 460-c. Or when the row decoder 470 is included in the circuit, by deactivating row decoder 470 so that the voltage from voltage rails 460-a to 460-c is not passed to the row lines 450. This configuration may reduce leakage between voltage rails 460-a and 460-b, particularly by mitigating the effects of shorts between access lines, such as row lines 450, that can occur during manufacturing. In yet other examples, the row lines 450 may be directly connected to voltage rail 460-b, which may be a ground or virtual ground.

Alternatively, voltage rails 460-a and 460-b may be in electronic communication with column decoder 465, which may route the respective voltage to corresponding the column lines 445. For instance, the decoder may apply the voltage from voltage rail 460-a to column lines 445-a to 445-c, and the voltage from voltage rail 460-b to column lines 445-d to 445-f. Using a decoder may enable a memory component to modify the capacitance of capacitive element 455 by activating or deactivating the column decoder 465.

Similarly, voltage rails 460-*a* and 460-*b* may be in electronic communication with row decoder 470, which may couple the respective voltage to the corresponding row lines 450. For instance, the decoder may couple the voltage from voltage rail 460-*a* to row lines 450-*a* to 450-*c*, and the voltage from voltage rail 460-*b* to row lines 450-*d* to 450-*f*. Using a decoder may enable a memory component to modify the capacitance of capacitive element 455 by activating or deactivating the column decoder 465.

In another example, the row lines 450, including row lines 450-*a* to 450-*d*, may be directly connected with intermediary voltage rail 460-*c*. In some cases, the magnitude of intermediary voltage rail 460-*c* is selected so to prevent the selection of any capacitive cells 430. Alternatively, row decoder 470 may be used to couple row lines 450-*a* to 450-*f* with intermediary voltage 460-*c*. In this way, current leakage from voltage rail 460-*a* to voltage rail 460-*b* through capacitive cells 430 may be reduced. Thus, the capacitive element 455 may include the capacitance between column lines 445-*a* to 445-*f*. In other cases, row decoder 470 may be used to couple row lines 450 with voltage rail 460-*b*, which may be a ground or virtual ground.

The scenarios and configurations discussed above are meant to be exemplary, and other configurations not explicitly discussed are possible. For instance, the operation of configuration 400-*a* may be modified so that voltage rails 460-*a* and 460-*b* are applied to row lines 450-*a* to 450-*f*, while column lines 445-*a* to 445-*f* are either isolated from voltage rails 460-*a* to 460-*c* or coupled with intermediary voltage rail 460-*c* or voltage rail 460-*b*, which may be a ground or virtual ground.

In FIG. 4B, configuration 400-*b* may include column lines 445-*a* to 445-*f*, row lines 450-*a* to 450-*f*, and voltage rails 460-*a* to 460-*c*. Configuration 400-*a* may also include spine 415 and periphery 420, which may include capacitive cells 430. Configuration 400-*a* may also include a third decoder 465-*a* (or column sub-decoder 465-*a*) and a fourth decoder 465-*b* (or column sub-decoders 465-*b*) and a fifth decoder 470-*a* (or row sub-decoder 470-*a*) and sixth decoder (or row sub-decoder 470-*b*).

Column sub-decoder 465-*a* may be in electronic communication with a first subset of column lines 445-*g*, while column sub-decoder 465-*b* may be in electronic communication with a second subset of column lines 445-*h*. Similarly, row sub-decoder 470-*a* may be in electronic communication with a first subset of row lines 450-*g*, while row sub-decoder 470-*b* may be in electronic communication with a second subset of row lines 450-*h*. In some cases, the column sub-decoders 465-*a* and 465-*b* and the row sub-decoders 470-*a* and 470-*b* are located on the bottom layer (e.g., configuration 400-*b*) of the memory component while the memory arrays (e.g., memory array 310) and the capacitive cells 430 are located on one or more layers above the bottom layer. In other cases, the column sub-decoder 465-*a* and 465-*b* and the row sub-decoder 470-*a* and 470-*b* are located on the same layer as the memory arrays (e.g., memory array 310).

Column sub-decoders 465-*a* and 465-*b* may be used to couple voltage rails 460-*a* and 460-*b* with column lines 445-*g* independently from column lines 445-*h*. For instance, column sub-decoder 465-*a* may be activated, connecting voltage rails 460-*a* and 460-*b* with column lines 445-*g*, while column sub-decoder 465-*b* may be deactivated, isolating column lines 445-*h* from voltage rails 460-*a* and 460-*b*. As discussed in FIG. 4C, voltage rails 460-*a* and 460-*b* may be connected to column lines 445-*g* in an alternating fashion to increase the capacitance represented by capacitive element 455 contributed by column lines 445-*g*, column lines 445-*h* may be similarly configured. Using sub-decoders to access a subset of the available column lines 445 (e.g., column lines 445-*g*) and a subset of the available capacitive cells 430, may allow a memory component to vary the capacitance of capacitive element 455 with more granularity than if only decoder is used or if voltage rails 460-*a* and 460-*b* are directly connected to all of the column lines 445.

In some examples, row sub-decoders 470-*a* and 470-*b* may be used to couple voltage rails 460-*a* and 460-*b* with row lines 450-*g* independently from row lines 450-*h*. For instance, row sub-decoder 470-*a* may be activated, connecting voltage rails 460-*a* and 460-*b* with row lines 450-*g*, while row sub-decoder 470-*b* may be deactivated, isolating row lines 450-*h* from voltage rails 460-*a* and 460-*b*. As discussed above and in FIG. 4C, voltage rails 460-*a* and 460-*b* may be connected to row lines 450-*g* in an alternating fashion to increase the capacitance of capacitive element 455 contributed by row lines 450-*g*, row lines 450-*h* may be similarly configured.

In some examples, row sub-decoders 470-*a* and 470-*b* may be used to couple intermediary voltage rail 460-*c* with row lines 450-*g* independently from row lines 450-*h*. And in other examples, row sub-decoders 470-*a* and 470-*b* may be used to isolate row lines 450-*g* from voltage rails 460-*a* to 460-*c* independently from row lines 450-*h*. In other examples, row sub-decoders 470-*a* and 470-*b* may be used to connect row lines 450-*g* to voltage rail 460-*b*, which may be a ground or virtual ground, independently from row lines 450-*h*. Furthermore, a memory component may use any combination of these configurations. For instance, row sub-decoder 470-*a* may be used to isolate row lines 450-*g* from voltage rails 460-*a* to 460-*c*, while row sub-decoder 470-*b* may be used to couple row lines 450-*h* with voltage rails 460-*a* and 460-*b* in an alternating fashion. Or in other cases, row sub-decoder 470-*a* may be used to isolate row lines 450-*g* from voltage rails 460-*a* to 460-*c*, while row sub-decoder 470-*b* may be used to couple row lines 450-*h* with intermediary voltage rails 460-*c*, and so on. A memory component may select a certain configuration or a certain combination of configurations to increase or decrease the capacitance of capacitive element 455 based on a number of factors including the accuracy of a supply voltage, the battery level of a device, a mode of a device (e.g., standby mode), a desired bit error rate, etc.

The scenarios and configurations discussed above are meant to be exemplary, and other configurations not explicitly discussed are possible. For instance, the operation of configuration 400-*a* may be modified so that voltage rails 460-*a* and 460-*b* are applied to row lines 450-*g* to 450-*h*, while column lines 445-*g* and 445-*h* are either isolated from voltage rails 460-*a* to 460-*c* or coupled with intermediary voltage rail 460-*c*, or some combination of the two.

In FIG. 4C, configuration 400-*c* may include column lines 445-*i* and 445-*j*, row lines 450-*i* and 450-*j*, and voltage rails 460-*a* to 460-*c*. Configuration 400-*a* may also include spine 415 and periphery 420, which may include capacitive cells 430. Configuration 400-*a* may optionally include column decoder 465-*c* and row decoder 470-*c*.

Column decoders 465-*c* may be used to apply some combination of the voltages from voltage rails 460-*a* to 460-*c* to column lines 445. Row decoders 470-*c* may similarly be used to apply some combination of the voltages from voltage rails 460-*a* to 460-*c* to row lines 450. Moreover, column lines 445 may be connected within the spine 415 and periphery 420 so that the voltage applied to a first column line 445 will be applied to every other column line 445, and the voltage applied to a second column line 445 will be applied the remaining column lines 445. Similarly, row lines 450 may be connected within the spine 415 and periphery 420 so that the voltage applied to a first row line 450 will be applied to every other row line 450, and the voltage applied to a second row line 450 will be applied the remaining row lines 450. This configuration may reduce the area allocated to control circuitry on configuration 400-*a*, such as column decoders 465 and row decoders 470. In some cases, the column decoder 465-*c* and the row decoder 470-*c* are located on the bottom layer (e.g., configuration 400-*b*) of the memory component while the memory arrays (e.g., memory array 310) and the capacitive cells 430 are located on one or more layers above the bottom layer. In other cases, the column decoder 465-*c* and the row decoder 470-*c* are located on the same layer as the memory arrays (e.g., memory array 310).

In some cases, voltage rail 460-*a* may be directly connected to column line 445-*i*, which may be directly connected to every other column line 445. While voltage rail 460-*b* may be directly connected to column line 445-*j*, which may be directly connected to each of the remaining column lines 445. Accordingly, the voltage rails 460-*a* and 460-*b* may be applied to the column lines 445 in an alternating fashion and the capacitance between the column lines 445 may be equivalent to the capacitance of capacitive element 455.

Similarly, voltage rail 460-*a* may be directly connected to row line 450-*i*. And row line 450-*i* may be connected to every other row line 450. While voltage rail 460-*b* may be directly connected to row line 450-*j*, which may be directly connected to each of the remaining row lines 450 and the capacitance between the row lines 450 may be equivalent to the capacitance of capacitive element 455. If voltage rails are coupled with both column lines 445 and row lines 450, then the capacitance of capacitive element 455 may be equivalent to the capacitance between the column lines 445 plus the capacitance between the row lines 450 plus the total capacitance of capacitive element that are selected. Alternatively, row lines 450-*i* and 450-*j* may be directly connected with intermediary voltage rail 460-*c*. Or row lines 450-*i* and 450-*j* may be isolated from voltage rails 460-*a* to 460-*c*. Or row lines 450-*i* and 450-*j* may be directly connected with voltage rails 460-*b*, which may be a ground or virtual ground.

In other cases, column decoder 465-*c* may be used to couple voltage rail 460-*a* with column line 445-*i*, which may be directly connected to every other column line 445, and to couple voltage rail 460-*b* with column line 445-*j*, which may be directly connected to the remaining column lines 445. Similarly, row decoder 470-*c* may be used to couple voltage rail 460-*a* with row line 450-*i*, which may be connected to every other row line 450, and to couple voltage rail 460-*b* with row line 450-*j*, which may be connected to the remaining row lines 450. Alternatively, row decoder 470-*c* may be used to couple row lines 450-*i* and 450-*j* with intermediary voltage 460-*c*. Or row decoder 470-*c* may be used to isolate row lines 450-*i* and 450-*j* from voltage rails 460-*a* to 460-*c*. Or row decoder 470-*c* may be used to couple row lines 450-*i* and 450-*j* with voltage rails 460-*b*, which may be a ground or virtual ground. The memory component utilize certain of the above configurations to modify the capacitance of capacitive element 455 based on a number of factors, including the accuracy of a supply voltage, the battery level of a device, a mode of a device (e.g., standby mode), a desired bit error rate, etc.

The scenarios and configurations discussed above are meant to be exemplary, and other configurations not explicitly discussed are possible. For instance, the operation of configuration 400-*a* may be modified so that voltage rails 460-*a* and 460-*b* are applied to row lines 450-*i* and 450-*j*, while column lines 445-*i* and 445-*j* are either isolated from voltage rails 460-*a* to 460-*c* or coupled with intermediary voltage rail 460-*c*.

Figure 5:
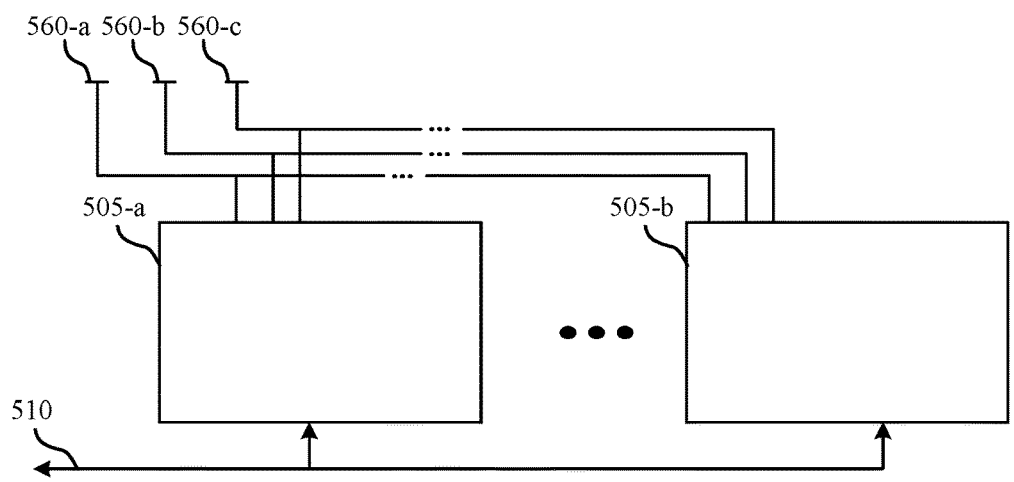
FIG. 5 illustrates an example capacitor scheme that supports a variable filter capacitance in accordance with various embodiments of the present disclosure.

FIG. 5 shows an example capacitor scheme 500 that supports a variable filter capacitance in accordance with embodiments of the present disclosure. Capacitor scheme 500 may include voltage rails 560-*a* to 560-*c*, capacitive elements 505-*a* through 505-*b* and control lines 510.

Voltage rails 560-*a* to 560-*c* may be an example of voltage rails 460 or 360 as described with reference to FIGS. 3 and 4. Voltage rails 560-*a* to 560-*c* may be in electronic communication with capacitive elements 505.

Capacitive elements 505 may be an example of a configuration 400 of a spine or periphery as described with reference to FIG. 4. Thus, capacitive elements 505 may include capacitive cells, access lines, and optionally decoders or sub-decoders as previously discussed. In some cases, the total capacitance of capacitive elements 505 may be represented by one large variable capacitor between two voltage rails. In some cases, all of capacitive elements 505 use the same configuration while in other cases subsets of capacitive elements 505 use the same configuration, or each capacitive element 505 may use its own configuration, or any combination thereof. Moreover, a device may activate or deactivate certain capacitive elements to modify the value of the overall filter capacitance produced by the capacitive elements 505. Capacitive elements 505 may also be in electronic with control lines 510.

Control lines 510 may carry control signals to and/or from capacitive elements 505. For instance, control lines 510 may carry control signals that activate or deactivate decoders or sub-decoders used to operate capacitive elements 505. Control lines 510 may also carry additional information such as measurements of temperature or voltage made at the capacitive elements 505 to one or more other components in a memory device. In some embodiments, these one or more other components may use the temperature and/or voltage measurements to determine which capacitive elements to activate. In some examples, the one or more other components may operate a memory component based on the temperature and/or voltage measurements. For instance, the memory component may avoid the use of sections corresponding to a capacitive element that exceed a certain temperature or may employ more robust read/write operations to section of the memory array that correspond to a capacitive element when the voltage is associated with a high level of noise.

Figure 6:
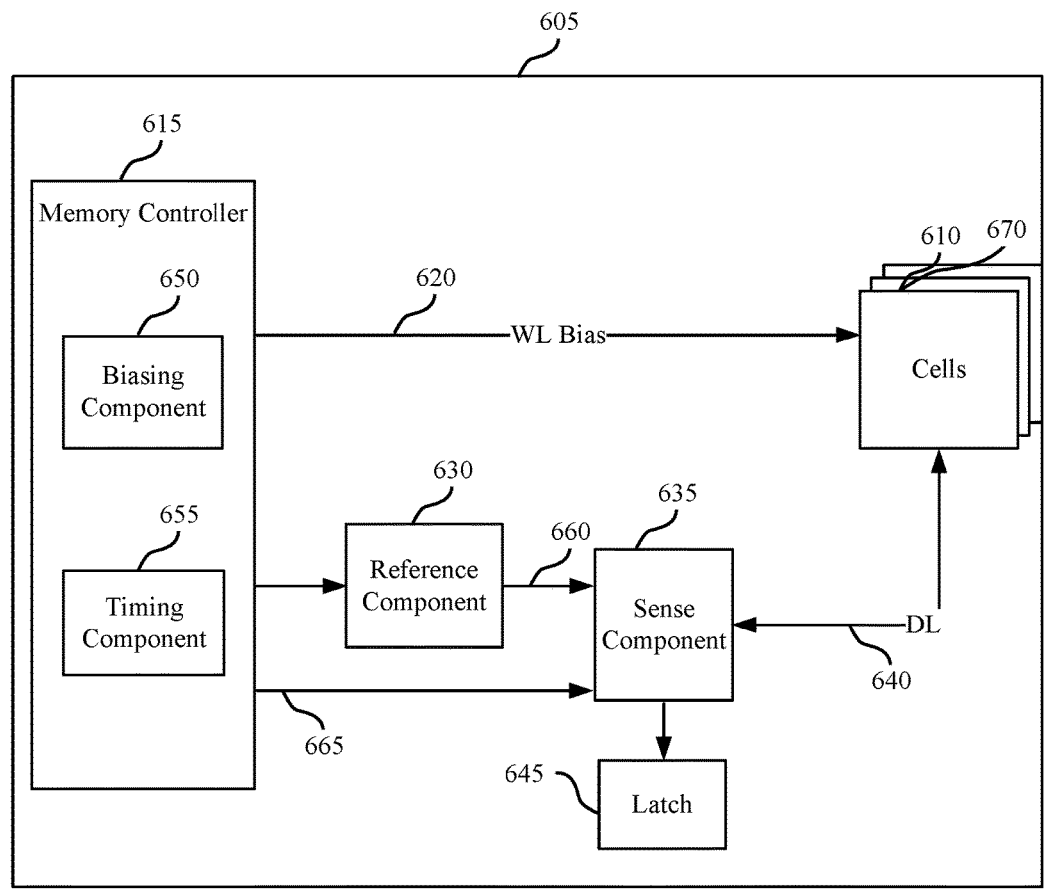
FIG. 6 illustrates a system, including a memory array, that supports varying a filter capacitance in accordance with various embodiments of the present disclosure.

FIG. 6 shows a block diagram 600 of a memory array 605 that supports variable filter capacitance in accordance with embodiments of the present disclosure. Memory array 605 may be referred to as an electronic memory apparatus, and may be an example of a component of a memory array 100 as described with reference to FIG. 1.

Memory array 605 may include one or more memory cells 610, capacitive cells 670, a memory controller 615, a word line 620, a reference component 630, a sense component 635, a digit line 640, and a latch 645. These components may be in electronic communication with each other and may perform one or more of the functions described herein. In some cases, memory controller 615 may include biasing component 650 and timing component 655. In some cases, Digit line 640 may also be referred to as a column line and word line 620 may also be referred to as a row line.

Memory controller 615 may be in electronic communication with word line 620, digit line 640, and sense component 635, which may be examples of word line 110, digit line 115, and sense component 125 described with reference to FIGS. 1 and 2. Memory array 605 may also include reference component 630 and latch 645. The components of memory array 605 may be in electronic communication with each other and may perform some or all of the functions described with reference to FIGS. 1 through 5. In some cases, reference component 630, sense component 635, and latch 645 may be components of memory controller 615.

In some examples, digit line 640 is in electronic communication with sense component 635 and a ferroelectric capacitor of ferroelectric memory cells 610. A ferroelectric memory cell 610 may be writable with a logic state (e.g., a first or second logic state). Word line 620 may be in electronic communication with memory controller 615 and a selection component of ferroelectric memory cell 610. Sense component 635 may be in electronic communication with memory controller 615, digit line 640, latch 645, and reference line 660. Reference component 630 may be in electronic communication with memory controller 615 and reference line 660. Sense control line 665 may be in electronic communication with sense component 635 and memory controller 615. These components may also be in electronic communication with other components, both inside and outside of memory array 605, in addition to components not listed above, via other components, connections, or busses.

Memory controller 615 may be configured to activate word line 620 or digit line 640 by applying voltages to those various nodes. For example, biasing component 650 may be configured to apply a voltage to operate memory cell 610 to read or write memory cell 610 as described above. In some cases, memory controller 615 may include a row decoder, column decoder, or both, as described with reference to FIG. 1. This may enable memory controller 615 to access one or more memory cells 105. Biasing component 650 may also provide voltage to reference component 630 in order to generate a reference signal for sense component 635. Additionally, biasing component 650 may provide voltage for the operation of sense component 635.

In some cases, memory controller 615 may perform its operations using timing component 655. For example, timing component 655 may control the timing of the various word line or digit line selections, including timing for switching and voltage application to perform the memory functions, such as reading and writing, discussed herein. In some cases, timing component 655 may control the operations of biasing component 650.

Reference component 630 may include various components to generate a reference signal for sense component 635. Reference component 630 may include circuitry configured to produce a reference signal. In some cases, reference component 630 may be implemented using other ferroelectric memory cells 105. Sense component 635 may compare a signal from memory cell 610 (through digit line 640) with a reference signal from reference component 630. Upon determining the logic state, the sense component may then store the output in latch 645, where it may be used in accordance with the operations of an electronic device that memory array 605 is a part. Sense component 635 may include a sense amplifier in electronic communication with the latch and the ferroelectric memory cell.

Memory controller 615 may be an example of the memory controller 815 described with reference to FIG. 8. Memory controller 615 and/or at least some of its various sub-components may be implemented in hardware, software executed by a processor, firmware, or any combination thereof. If implemented in software executed by a processor, the functions of the memory controller 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 615 and/or at least some of its various sub-components may be physically located at various positions, including being distributed such that portions of functions are implemented at different physical locations by one or more physical devices. In some examples, memory controller 615 and/or at least some of its various sub-components may be a separate and distinct component in accordance with various embodiments of the present disclosure. In other examples, memory controller 615 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

In some examples, memory controller 615 may apply a first voltage to a first digit line 640-*a* and a second digit line 640-*b* of set of digit lines 640 of a memory array, where the set of digit lines 640 is in electronic communication with a set of capacitive cells 670 and is perpendicular to a set of word lines 620 that is in electronic communication with the set of capacitive cells 670. Memory controller 615 may also apply a second voltage to a third digit line 640-*c* of the set of digit lines 640, where the third digit line 640-*c* is adjacent to the first digit line 640-*a* and the second digit line 640-*c* of the first set of digit lines. In some cases, memory controller 615 may trigger the biasing component 650 or the sense component 635 to apply a voltage to an access line. Memory controller 615 may further regulate the first voltage or the second voltage, or both, for at least a portion of the memory array with a capacitance between digit lines 640-*a* to 640-*c* resulting from the application of the first voltage and the second voltage.

Figure 7:
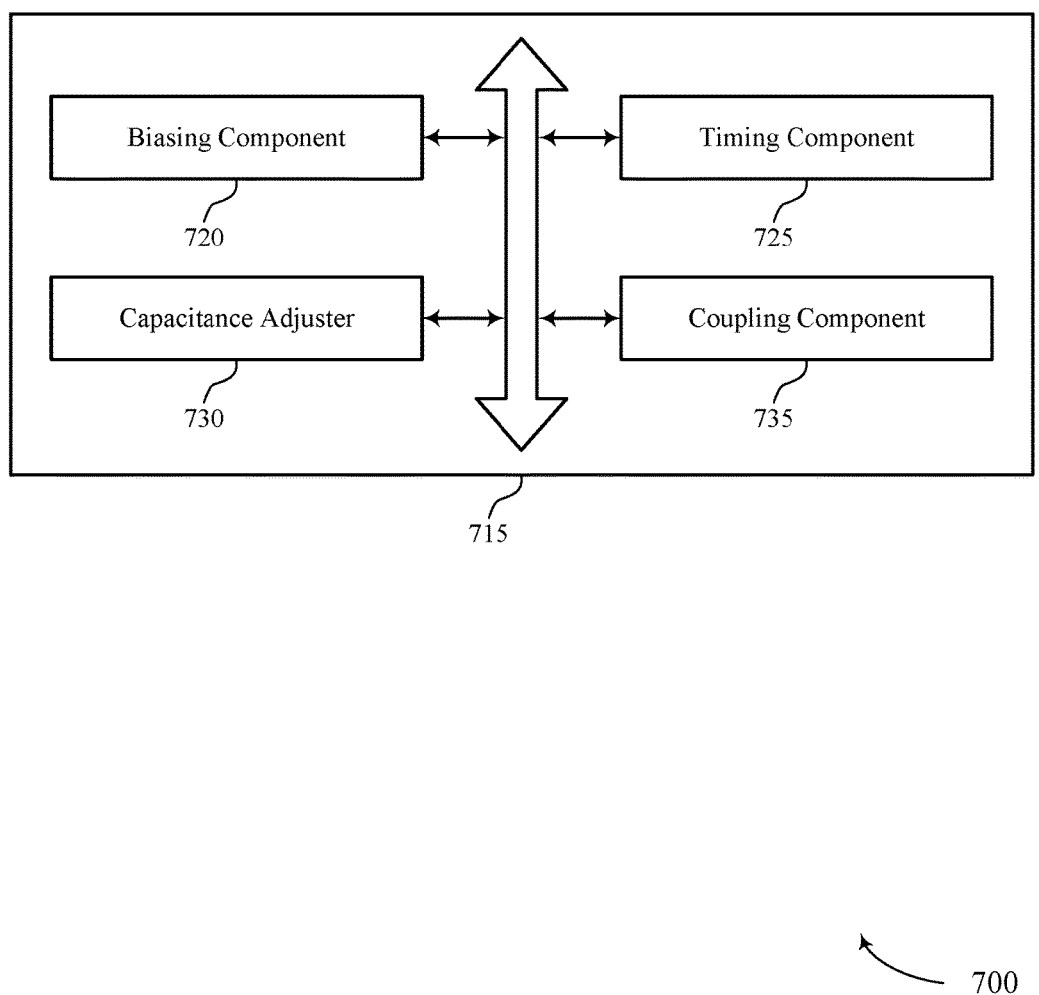
FIG. 7 illustrates a memory controller that supports varying a filter capacitance in accordance with various embodiments of the present disclosure.

FIG. 7 shows a block diagram 700 of a memory controller 715 that supports variable filter capacitance in accordance with embodiments of the present disclosure. The memory controller 715 may be an example of a memory controller 815 described with reference to FIGS. 5, 6, and 8. The memory controller 715 may include biasing component 720, timing component 725, capacitance adjuster 730, and coupling component 735. Biasing component 720 and timing component 725 may be examples of a biasing component 650 or a timing component 655 as described with reference to FIG. 6. Each of these modules may communicate, directly or indirectly, with one another (e.g., via one or more buses).

Capacitance adjuster 730 may regulate the first voltage or the second voltage, or both, for at least a portion of the memory array with a capacitance between access lines of the first set of access lines resulting from the application of the first voltage and the second voltage. In some cases, capacitance adjuster 730 may trigger biasing component 720 to apply a first voltage to a first access line and a second access line of a first set of access lines of a memory array, where the first set of access lines is in electronic communication with a set of capacitive cells and is perpendicular to a second set of access lines that is in electronic communication with the set of capacitive cells. Biasing component 720 may also be triggered to apply a second voltage to a third access line of the first set of access lines, and to apply a third voltage to the second set of access lines. In some cases, a magnitude of the third voltage may be greater than a magnitude of the first voltage and less than a magnitude of the second voltage. The third access line of the first set of access lines may be adjacent to the first access line and the second access line of the first set of access lines.

Capacitance adjuster 730 may similarly regulate the first voltage or the second voltage, or both, for at least a portion of the memory array with a based on the capacitance between the access lines of the first set of access lines and another capacitance between access lines of the second set of access lines resulting from the application of the first voltage and the second voltage. Capacitance adjuster 730 may trigger biasing component 720 to apply the first voltage to a first access line and a second access line of the second set of access lines and to apply the second voltage to a third access line of the second set of access lines. The third access line of the second set of access lines may be adjacent to the first access line and the second access line of the second set of access lines.

In some cases, applying the first voltage includes triggering the coupling component 735 to electronically couple a first voltage rail to the first access line and the second access line of the second set of access lines and applying the second voltage includes triggering the coupling component 735 to electronically couple a second voltage rail to the third access line of the second set of access lines. Coupling component 735 may also electronically couple the first voltage rail to a fourth access line and a fifth access line of the first set of access lines and the second voltage rail to a sixth access line of the first set of access lines. In some cases, the first voltage rail is connected to a positive voltage source and the second voltage rail is connected to ground or virtual ground.

In some cases, the first voltage rail and the second voltage rail may be electronically coupled with the first, second, and the third access lines of the first set of access lines independently of electronically coupling the first voltage rail and the second voltage rail with the fourth, fifth, and sixth access lines of the first set of access lines. In some cases, the coupling component 735 electronically couples the first voltage rail and the second voltage rail with the first, second, and third access lines of the first set of access lines by activating a first decoder that is in electronic communication with the first voltage rail, the second voltage rail, and the first set of access lines. In some cases, the coupling component 735 electronically couples the first voltage rail and the second voltage rail with the fourth, fifth, and sixth access lines of the first set of access lines by activating a second decoder that is in electronic communication with the first voltage rail, the second voltage rail, and the first set of access lines.

The coupling component 735 may also isolate the second set of access lines from the first voltage and the second voltage. In some cases, the coupling component 735 isolates the second set of access lines from the first voltage and the second voltage by deactivating a decoder that is in electronic communication with the second set of access lines, the first voltage, and the second voltage. In some cases, the coupling component 735 electronically couples the first voltage rail and the second voltage rail with the first, second, and third access lines of the second set of access lines by activating a first decoder that is in electronic communication with the first voltage rail, the second voltage rail, and the second set of access lines.

Figure 8:
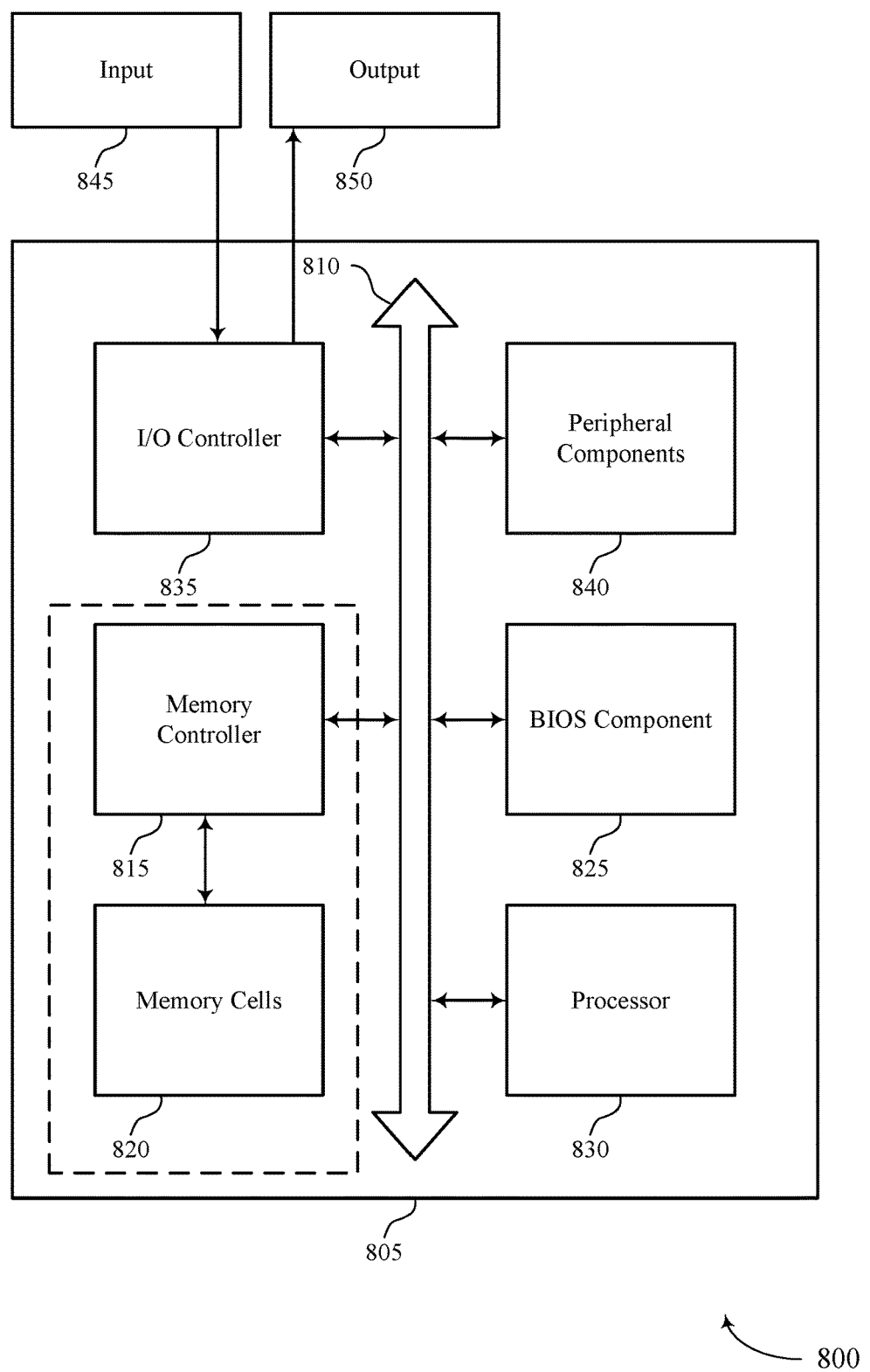
FIG. 8 illustrates a system, including a memory array, that supports varying a filter capacitance in accordance with various embodiments of the present disclosure.

FIG. 8 shows a diagram of a system 800 including a device 805 that supports variable filter capacitance in accordance with embodiments of the present disclosure. Device 805 may be an example of or include the components of memory array 100 as described above, e.g., with reference to FIG. 1. Device 805 may include components for bi-directional voice and data communications including components for transmitting and receiving communications, including memory controller 815, memory cells 820, basic input/output system (BIOS) component 825, processor 830, I/O controller 835, and peripheral components 840. These components may be in electronic communication via one or more busses (e.g., bus 810).

Memory controller 815 may operate one or more memory cells as described herein. Specifically, memory controller 815 may be configured to support variable filter capacitance. In some cases, memory controller 815 may include a row decoder, column decoder, or both, as described with reference to FIG. 1 (not shown).

Memory cells 820 may store information (i.e., in the form of a logical state) as described herein. BIOS component 825 be a software component that includes BIOS operated as firmware, which may initialize and run various hardware components. BIOS component 825 may also manage data flow between a processor and various other components, e.g., peripheral components, input/output control component, etc. BIOS component 825 may include a program or software stored in read only memory (ROM), flash memory, or any other non-volatile memory.

Processor 830 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 830 may be configured to operate a memory array using a memory controller. In other cases, a memory controller may be integrated into processor 830. Processor 830 may be configured to execute computer-readable instructions stored in a memory to perform various functions (e.g., functions or tasks supporting variable filter capacitance).

I/O controller 835 may manage input and output signals for device 805. I/O controller 835 may also manage peripherals not integrated into device 805. In some cases, I/O controller 835 may represent a physical connection or port to an external peripheral. In some cases, I/O controller 835 may utilize an operating system such as iOS®, ANDROID®, MS-DOS®, MS-WINDOWS®, OS/2®, UNIX®, LINUX®, or another known operating system. In other cases, I/O controller 835 may represent or interact with a modem, a keyboard, a mouse, a touchscreen, or a similar device. In some cases, I/O controller 835 may be implemented as part of a processor. In some cases, a user may interact with device 805 via I/O controller 835 or via hardware components controlled by I/O controller 835.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 845 may represent a device or signal external to device 805 that provides input to device 805 or its components. This may include a user interface or an interface with or between other devices. In some cases, input 845 may be managed by I/O controller 835, and may interact with device 805 via a peripheral component 840.

Output 850 may also represent a device or signal external to device 805 configured to receive output from device 805 or any of its components. Examples of output 850 may include a display, audio speakers, a printing device, another processor or printed circuit board, etc. In some cases, output 850 may be a peripheral element that interfaces with device 805 via peripheral component(s) 840. In some cases, output 850 may be managed by I/O controller 835

The components of device 805 may include circuitry designed to carry out their functions. This may include various circuit elements, for example, conductive lines, transistors, capacitors, inductors, resistors, amplifiers, or other active or inactive elements, configured to carry out the functions described herein. Device 805 may be a computer, a server, a laptop computer, a notebook computer, a tablet computer, a mobile phone, a wearable electronic device, a personal electronic device, or the like. Or device 805 may be a portion or component of such a device.

Figure 9:
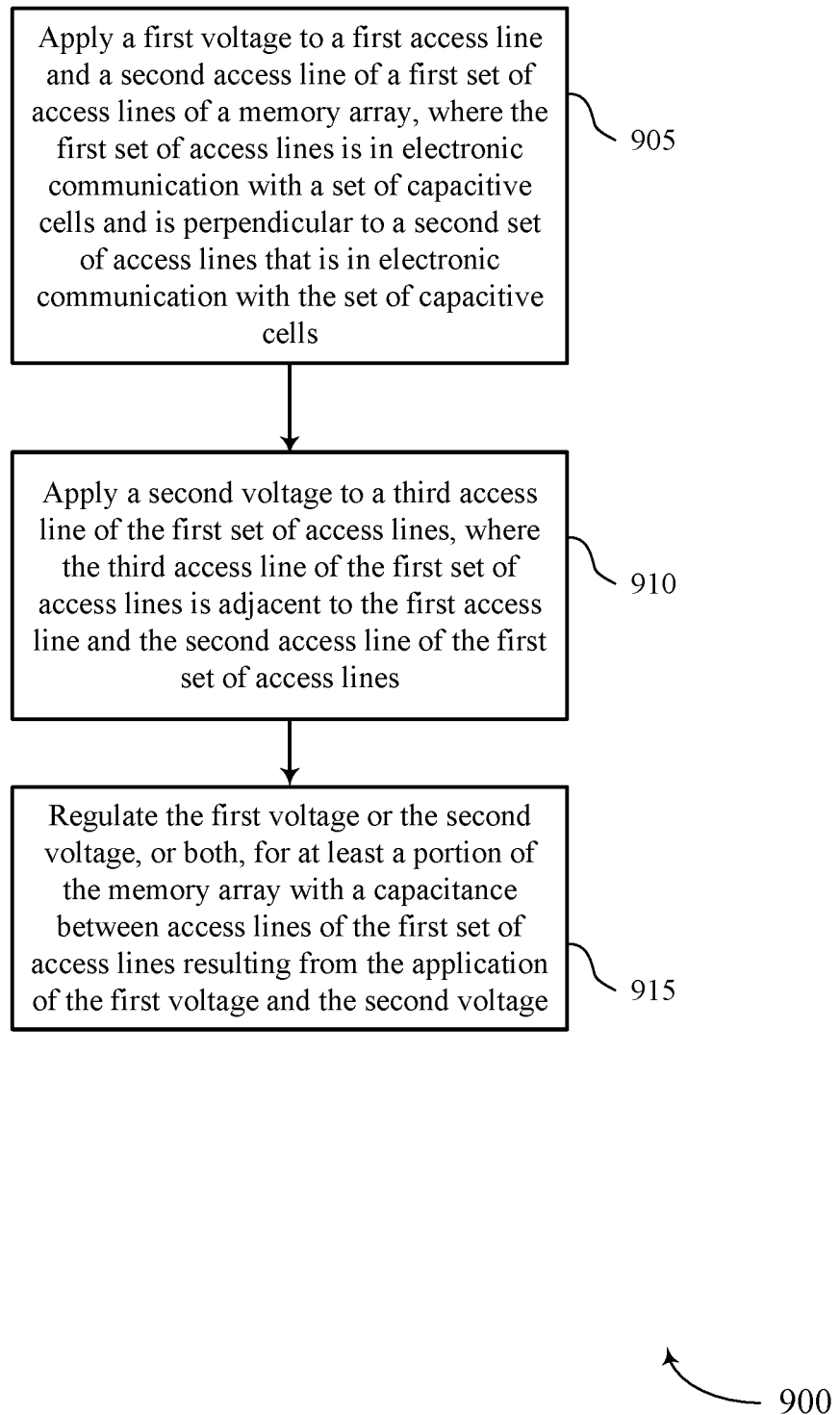
FIG. 9 is a flowchart that illustrate a method or methods for varying a filter capacitance in accordance with various embodiments of the present disclosure.

FIG. 9 shows a flowchart illustrating a method 900 for variable filter capacitance in accordance with embodiments of the present disclosure. The operations of method 900 may be implemented by a memory array or its components as described herein. For example, the operations of method 900 may be performed by a memory controller as described with reference to FIGS. 6 through 8. In some examples, a memory array may execute a set of codes to control the functional elements of the device to perform the functions described below. Additionally or alternatively, the memory array may perform some or all of the functions described below using special-purpose hardware.

At block 905, the memory array may apply a first voltage to a first access line and a second access line of a first plurality of access lines of a memory array, wherein the first plurality of access lines is in electronic communication with a plurality of capacitive cells and is perpendicular to a second plurality of access lines that is in electronic communication with the plurality of capacitive cells. The operations of block 905 may be performed according to the methods described with reference to FIGS. 3-5 In certain examples, some or all of the operations of block 905 may be performed by a biasing component as described with reference to FIGS. 6 through 8. In some examples, the first plurality of access lines may be column lines and the second plurality of access lines may be row lines, or vice versa. And the capacitive cell may include a capacitive element and a selection component, where the capacitive element may be either a ferroelectric capacitor or a dielectric capacitor.

In some cases, applying the first voltage comprises electronically coupling a first voltage rail to the first access line and the second access line of the first plurality of access lines, where electronically coupling the first voltage rail to the first access line and the second access line may include any of: directly connecting the first voltage rail to the first access line and the second access line via a conductive trace, activating a switching device that is in electronic communication with the first voltage rail, the first access line, and the second access line, or using a decoder to route the first voltage from the first voltage rail to the first access line and the second access line.

At block 910, the memory array may apply a second voltage to a third access line of the first plurality of access lines, wherein the third access line of the first plurality of access lines is adjacent to the first access line and the second access line of the first plurality of access lines. The operations of block 910 may be performed according to the methods described with reference to FIGS. 3-5 In certain examples, some or all of the operations of block 910 may be performed by a biasing component as described with reference to FIGS. 6 through 8. Applying the second voltage to an access line that is adjacent to the access lines connected to the first voltage may increase the capacitance between the first and second voltages using the capacitance between the first and second access lines, which may in turn decrease the magnitude of irregularities in the magnitude of the first and second voltages.

In some cases, applying the second voltage comprises electronically coupling a second voltage rail to the third access line of the first plurality of access lines. In some examples, the first voltage rail is connected to a positive voltage source and the second voltage rail is connected to ground or virtual ground. Electronically coupling the second voltage rail to the third access line may include any of: directly connecting the first voltage rail to the first access line and the second access line via a conductive trace, activating a switching device that is in electronic communication with the first voltage rail, the first access line, and the second access line, or using a decoder to route the first voltage from the first voltage rail to the first access line and the second access line.

In some cases, electronically coupling the first voltage rail and the second voltage rail with the first, second, and third access lines of the first plurality of access lines comprises activating a first decoder that is in electronic communication with the first voltage rail, the second voltage rail, and the first plurality of access lines. Using a decoder to electronically couple the first and second voltage rails with the first, second, and third access lines may allow a memory device to dynamically adapt the capacitance between the first and second voltage rail.

At block 915, the memory array may regulate the first voltage or the second voltage, or both, for at least a portion of the memory array with a capacitance between access lines of the first plurality of access lines resulting from the application of the first voltage and the second voltage. The operations of block 915 may be performed according to the methods described with reference to FIGS. 3-5 In certain examples, some or all of the operations of block 915 may be performed by a capacitance adjuster as described with reference to FIGS. 6 through 8.

In some examples, the memory array may electronically couple the first voltage rail to a fourth access line and a fifth access line of the first plurality of access lines. The memory array may also electronically couple the second voltage rail to a sixth access line of the first plurality of access lines. Electronically coupling the first and second voltage rails to additional access lines may increase the capacitance between the first and second voltage rails.

In some cases, the first voltage rail and the second voltage rail are electronically coupled with the first, second, and the third access lines of the first plurality of access lines independently of electronically coupling the first voltage rail and the second voltage rail with the fourth, fifth, and sixth access lines of the first plurality of access lines. Electronically coupling the first and second voltage rails to the additional access lines independent of other access lines may allow a memory device to increase or decrease the capacitance between the first voltage rail and the second voltage rail in discrete increments. A memory device may modulate the capacitance with a finer granularity when more access lines can be coupled with the first and second voltage rails independently from other access lines.

In some examples, coupling the first voltage rail and the second voltage rail with the fourth, fifth, and sixth access lines of the first plurality of access lines may include activating a second decoder that is in electronic communication with the first voltage rail, the second voltage rail, and the first plurality of access lines. Sub-decoders may be used to electronically couple the first and second voltage rails with one set of access lines independently from another set of access lines. Sub-decoders may also enable a device to reduce or increase power consumption of the memory device by configuring the first plurality of access lines and the second plurality of access lines accordingly.

In some examples the memory array may isolate the second plurality of access lines from the first voltage and the second voltage. Isolating the second plurality of access lines from the first voltage and the second voltage may include deactivating a decoder that is in electronic communication with the second plurality of access lines, the first voltage, and the second voltage. Isolating the second plurality of access lines from the first voltage and the second voltage may decrease current leakage between the first and second voltage by mitigating the effects of electrical shorts between access lines resulting from manufacturing flaws, reducing power consumption of the memory device.

In some examples, the memory array may apply a third voltage to the second plurality of access lines, wherein a magnitude of the third voltage is greater than a magnitude of the first voltage and less than a magnitude of the second voltage. Applying an intermediary voltage to the second plurality of access lines may ensure that the capacitive cells are not selected, decreasing current leakage through the capacitive cells, reducing power consumption of the memory device.

In some examples, the memory array may apply the first voltage to a first access line and a second access line of the second plurality of access lines and the second voltage to a third access line of the second plurality of access lines. Applying the first voltage may include electronically coupling a first voltage rail to the first access line and the second access line of the second plurality of access lines. Applying the second voltage comprises electronically coupling a second voltage rail to the third access line of the second plurality of access lines. In some case, electronically coupling the first voltage rail and the second voltage rail with the first, second, and third access lines of the second plurality of access lines comprises activating a first decoder that is in electronic communication with the first voltage rail, the second voltage rail, and the second plurality of access lines. Applying the first and second voltages to the second plurality of access lines in a similar manner to how the first and second voltages are applied to the first plurality of access lines may increase the capacitance between the first and second supply rails using the capacitance between access lines of the second plurality of access line, in addition to the capacitance of the capacitive cells.

In some cases, the first voltage or the second voltage, or both, is regulated based on the capacitance between the access lines of the first plurality of access lines and another capacitance between access lines of the second plurality of access lines resulting from the application of the first voltage and the second voltage.

It should be noted that the methods described above describe possible implementations, and that the operations and the steps may be rearranged or otherwise modified and that other implementations are possible. Furthermore, embodiments from two or more of the methods may be combined.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

As used herein, the term "short," "shorted, or "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   determining a capacitance for regulating irregularities in a voltage of a memory array that comprises capacitive elements, wherein at least one of the capacitive elements comprises cells and access lines in electronic communication with the cells;
   selecting a subset of the capacitive elements based at least in part on the capacitance; and
   activating the subset of the capacitive elements based at least in part on the selecting, wherein the capacitance is based at least in part on a combined capacitance of the subset of the capacitive elements after the activation.

2. The method of claim 1, further comprising:
   electronically coupling a first voltage rail and a second voltage rail with a first subset of the access lines, wherein the combined capacitance of the subset of capacitive elements regulates a first voltage of the first voltage rail, or a second voltage of the second voltage rail, or both.

3. The method of claim 1, further comprising:
   measuring, at a first capacitive element of the capacitive elements, a temperature of a first portion of the memory array; and
   determining that the temperature of the first portion of the memory array exceeds a threshold based at least in part on the measuring, wherein selecting the subset of the capacitive elements comprises:
      selecting other capacitive elements than the first capacitive element for the subset of the capacitive elements based at least in part on the temperature of the first portion of the memory array exceeding the threshold.

4. The method of claim 1, further comprising:
   performing an access operation in a first portion of the memory array using a first access technique;
   measuring, at a first capacitive element, a noise level of a second portion of the memory array;
   determining that the noise level associated with the second portion of the memory array exceeds a threshold based at least in part on the measuring; and
   performing an access operation in the second portion of the memory array using a second access technique based at least in part on the noise level exceeding the threshold, wherein the second access technique has an increased reliability relative to the first access technique.

5. The method of claim 1, further comprising:
   configuring a first capacitive element comprising first access lines and first cells to have a first capacitance that comprises a capacitance between the first access lines.

6. The method of claim 5, further comprising:
   configuring a second capacitive element comprising second access lines and second cells to have a second capacitance that comprises the capacitance between the first access lines and a combined capacitance of the second cells, wherein the subset of the capacitive elements comprises the first capacitive element and the second capacitive element, and wherein the combined capacitance of the subset of the capacitive elements comprises the first capacitance and the second capacitance.

7. The method of claim 1, further comprising:
   determining that the capacitance and an aggregated capacitance of all of the capacitive elements in the subset of the capacitive elements is equivalent, wherein the subset of the capacitive elements is selected based at least in part on the equivalence.

8. The method of claim 1, wherein each of the capacitive elements comprises a decoder, and wherein activating the subset of the capacitive elements comprises:
   activating a respective decoder corresponding to a respective capacitive element of the subset of the capacitive elements.

9. An apparatus, comprising:
   first cells in electronic communication with first access lines;
   second cells in electronic communication with second access lines; and
   capacitive elements configured to generate a capacitance for regulating irregularities in voltage of a memory array, wherein at least one of the capacitive elements comprises a subset of the first cells and a subset of the first access lines, and wherein the capacitance for the memory array comprises a capacitance of a subset of the capacitive elements.

10. The apparatus of claim 9, further comprising:
    voltage rails in electronic communication with the capacitive elements, the capacitive elements configured to generate the capacitance between the voltage rails.

11. The apparatus of claim 9, further comprising:
    a control line in electronic communication with the capacitive elements and configured to carry:
       a signal for activating the subset of the capacitive elements;
       a signal for deactivating one or more of the capacitive elements; or
       measurements of the memory array from the capacitive elements, or any combination thereof.

12. The apparatus of claim 11, further comprising:
    decoders in electronic communication with the control line and configured to operate the capacitive elements, wherein at least one capacitive element of the capacitive elements comprises a subset of the decoders.

13. The apparatus of claim 9, wherein a first capacitive element of the capacitive elements is located in a first subarray of the memory array and a second capacitive element of the capacitive elements is located in a second subarray of the memory array.

14. The apparatus of claim 9, wherein a first capacitive element of the capacitive elements is located in a first layer of the memory array and a second capacitive element of the capacitive elements is located in a second layer of the memory array.

15. The apparatus of claim 9, wherein the first cells are configured to generate the capacitance and the second cells are configured to store logic states.

16. The apparatus of claim 9, wherein the first access lines comprises:
a set of bit lines oriented in a first direction; and
a set of word lines oriented in a second direction that is different than to the first direction.

17. An apparatus, comprising:
access lines that are in electronic communication with cells;
a memory array comprising capacitive elements, wherein at least one of the capacitive elements comprises a subset of the access lines and a subset of the cells; and
a controller in electronic communication with the capacitive elements, wherein the controller is operable to:
determine a capacitance for regulating irregularities in a voltage of the memory array;
select a subset of the capacitive elements based at least in part on the capacitance; and
activate the subset of the capacitive elements based at least in part on the selecting, wherein the capacitance is based at least in part on a combined capacitance of the subset of the capacitive elements.

18. The apparatus of claim 17, further comprising:
voltage rails, wherein the controller is further operable to:
electronically couple the voltage rails with the subset of the capacitive elements, wherein the combined capacitance of the subset of the capacitive elements regulates voltages of the voltage rails.

19. The apparatus of claim 17, further comprising:
decoders that are in electronic communication with the capacitive elements, wherein the controller is further operable to:
activate a subset of the decoders corresponding to the subset of the capacitive elements.

20. The apparatus of claim 17, wherein the controller is further operable to:
calculate an aggregated capacitance of all of the capacitive elements in the subset of the capacitive elements.

* * * * *